(12) United States Patent
Washino

(10) Patent No.: US 7,027,107 B2
(45) Date of Patent: Apr. 11, 2006

(54) RECEIVING DEVICE USED IN HIGH-DEFINITION TELEVISION

(75) Inventor: Takao Washino, Funabashi (JP)

(73) Assignee: Funai Electric Co., Ltd., Daito (JP)

( * ) Notice: Subject to any disclaimer, the term of this patent is extended or adjusted under 35 U.S.C. 154(b) by 416 days.

(21) Appl. No.: 10/075,587

(22) Filed: Feb. 15, 2002

(65) Prior Publication Data

US 2002/0109793 A1     Aug. 15, 2002

(30) Foreign Application Priority Data

Feb. 15, 2001   (JP)   ............... 2001-038948

(51) Int. Cl.
*H04N 5/50* (2006.01)
(52) U.S. Cl. ...................... 348/732; 348/735
(58) Field of Classification Search ................ 348/725, 348/726, 731, 732, 735; 375/326, 340; 455/164.1, 455/182.1, 185.1, 182.2, 186.1, 191.1, 192.1, 455/193.1, 245.1
See application file for complete search history.

(56) References Cited

U.S. PATENT DOCUMENTS

| | | | | |
|---|---|---|---|---|
| 5,634,205 A | * | 5/1997 | Kurisu et al. | ............ 455/182.2 |
| 5,734,972 A | * | 3/1998 | Hayashino et al. | ...... 455/182.2 |
| 5,809,088 A | * | 9/1998 | Han | ........................... 375/344 |
| 5,974,087 A | * | 10/1999 | Nowara | ...................... 375/226 |
| 6,320,917 B1 | * | 11/2001 | Stott et al. | ................... 375/344 |
| 6,421,099 B1 | * | 7/2002 | Oh | ............................. 348/732 |
| 6,456,672 B1 | * | 9/2002 | Uchiki et al. | ............... 375/344 |
| 6,594,286 B1 | * | 7/2003 | Chen et al. | ................. 370/529 |
| 6,704,555 B1 | * | 3/2004 | Sih et al. | ................. 455/245.1 |

FOREIGN PATENT DOCUMENTS

JP          09-121315          5/1997

* cited by examiner

*Primary Examiner*—Victor R. Kostak
(74) *Attorney, Agent, or Firm*—Crowell & Moring LLP

(57) ABSTRACT

In a receiving device of the invention used in high-definition television, a frequency information storage section stores error information of a frequency error of a signal output from an oscillator. A control unit controls the oscillator based on the error information stored in the frequency information storage section. In a simple configuration, it is, therefore, possible to shift, the frequency in a direction of tuning by a tuner, to thereby output the signal with an appropriate frequency from the oscillator without being influenced by an accuracy of the oscillator, thus to demodulate the received signal accurately. Accordingly, it can be avoided such a problem that no pilot signal is present in an IF signal within a predetermined band width filtered by a SAW filter or that the pilot signal, even if present, cannot be received.

4 Claims, 3 Drawing Sheets

RECEIVING DEVICE USED IN HIGH-DEFINITION TELEVISION

BACKGROUND OF THE INVENTION

The invention relates to a receiving device used in radio communication for transferring a pilot signal and, more particularly to, a receiving device applied to a high-definition television.

Conventionally, there has been such a communication method that transfers a pilot signal so that a receiving device can demodulate a received signal accurately. As well known, the pilot signal is used to detect a carrier wave accurately on the receiving device. For example, the high-definition television broadcasting employed in U.S.A. etc. utilizes this communication method of transferring the pilot signal mentioned above.

Conventional high-definition television is equipped with an oscillator for outputting a signal having a frequency which corresponds to a currently selected channel. A tuner outputs a signal of an intermediate frequency (hereinafter refer to IF signal) which is obtained by tuning a radio wave received through an antenna to an output signal from this oscillator. Then, this IF signal is filtered by a SAW filter (surface acoustic wave filter) within a predetermined frequency band width. The band width of the SAW filter is, for example, 6 MHz.

The IF signal within the predetermined band width filtered at the SAW filter is amplified by an amplifier and then input to a demodulator. The demodulator extracts the pilot signal from thus received signal and demodulates the IF signal by using extracted pilot signal.

However, if the frequency accuracy of the output signal of the oscillator equipped in the receiving device is poor, the frequency of the IF signal output from the tuner is shifted from an appropriate value. If, for example, a frequency of the signal output from the oscillator actually is B despite that the receiving device controls the output signal of the oscillator so that the frequency may be A, a frequency error of the output signal of the oscillator is (A−B). If this frequency error is large, no pilot signal is present in the IF signal within the predetermined band width filtered by the SAW filter or that the pilot signal, even if present, cannot be extracted. This accident leads to such a problem that the signal cannot be received.

Also, the broadcasting station sometimes broadcasts a program with its carrier wave frequency as shifted (i.e., using an offset carrier wave). For example, if there is a broadcasting station broadcasting a program using a carrier wave having a frequency which is close to that in an adjacent area, an offset carrier wave may be used to avoid radio interference with this broadcasting station in U.S.A..

In this case also, no pilot signal is present in the IF signal within a predetermined band width filtered by a SAW filter or that the pilot signal, even if present, cannot be extracted. This accident, therefore, leads to a problem that the signal cannot be received like in the case mentioned above where the frequency error is large.

A technology for solving the problem mentioned above is disclosed in, for example, Japanese Unexamined Patent Publication No. 9-121315. It proposes that a pass-band width of the SAW filter should be shifted in a direction of tuning the signal by the tuner. The configuration thereof, however, is complicated, to increase the costs of the device, so it is not a practical method.

SUMMARY OF THE INVENTION

It is an object of the invention to provide a receiving device for use in high-definition television that can demodulate a received signal accurately in a simple configuration.

To solve the problem mentioned above, the receiving device of the invention has the following configuration.

The receiving device used in high-definition television, which includes, a receiver for receiving a radio signal containing a pilot signal; an oscillator for outputting a signal having a frequency that corresponds to a currently selected channel; a tuner for outputting an intermediate frequency signal obtained by tuning the radio signal received at the receiver to the signal output from the oscillator; a filter for filtering the intermediate frequency signal within a frequency band width which the pilot signal can pass through output from the tuner; and a demodulator for extracting the pilot signal from the signal filtered at the filter and for demodulating the filtered signal by using the extracted pilot signal; comprising: a frequency deviation measuring section for measuring a deviation of a frequency of a carrier wave for each channel; a memory for storing deviation information based on a measurement result given by the frequency deviation measuring section and error information of a frequency error of the signal output from the oscillator; a control unit for controlling the frequency of the signal output from the oscillator based on the deviation information and the error information stored in the memory; and a deviation information updating section for updating the deviation information stored in the memory by performing the frequency deviation measurement for the currently selected channel if the pilot signal could not be extracted by the demodulator, wherein, the frequency deviation measuring section detects the frequency of the signal output from the oscillator when the pilot signal could be extracted by the demodulator as changing the frequency of the signal output from the oscillator.

In the configuration mentioned above, error information of a frequency error of a signal output from the oscillator is stored in the memory. The control unit controls the frequency of a signal output from the oscillator based on the error information stored in the memory. Therefore, the oscillator can output the signal having an appropriate frequency without being influenced by the accuracy of its own. It is, therefore, possible to avoid such a situation that no pilot signal is present in an IF signal within a predetermined band width filtered by the filter or that the pilot signal, even if present, cannot be extracted (received).

Also, since the action and effect mentioned above can be obtained only by adding a simple configuration that the error information of a frequency error of the signal output from the oscillator is stored in the memory, a problem of an increase in cost of the device can be avoid. The frequency error can be stored in the memory at the time of manufacturing the device.

Also, a frequency-deviation measuring section measures a deviation of the carrier wave frequency for each channel and stores a measurement result in the memory. The control unit controls the frequency of a signal output from the oscillator based on the frequency deviation stored in the memory. Therefore, even if the frequency of a carrier wave is shifted on the side of a broadcasting station, a signal of an appropriate frequency can be output from the oscillator to the frequency-shifted carrier wave. It is, therefore, possible to demodulate a received signal securely free of such a problem that no pilot signal is present in an IF signal within a predetermined band width filtered by the filter or that the pilot signal, even if present, cannot be extracted.

Also, if the pilot signal mentioned above cannot be extracted at the demodulator, the frequency deviation is measured for a selected channel as described above so that the deviation information of this selected channel may be updated.

Also, when the demodulator could extract the pilot signal, the frequency of a signal which had been output from the oscillator is detected by demodulator. Thus the detected frequency or a difference between the detected frequency and prescribed frequency may be stored in the memory as deviation information.

The frequency deviations may be measured sequentially for the receivable channels at an appropriate timing to be stored as the deviation information in the memory. The appropriate timing may be, for example, such one that a specific key on the device body is operated or that each channel is detected on whether it is transmitting a broadcast, that is, the timing of auto scanning.

DETAILED DESCRIPTION OF THE PREFERRED EMBODIMENT OF THE PRESENT INVENTION

Figure 1:
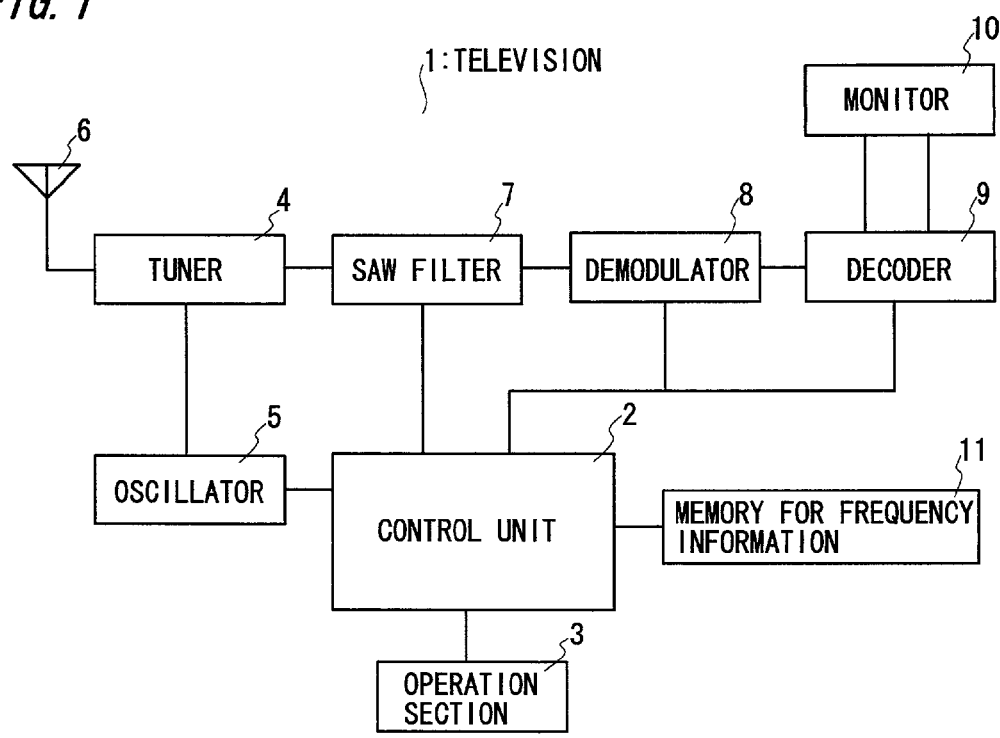
FIG. 1 is a block diagram for showing a configuration of a high-definition television to which a receiving device according to an embodiment of the invention is applied.

FIG. 1 shows a configuration of a high-definition television to which a receiving device of the invention is applied. A high-definition television 1 of this embodiment can be utilized in a U.S.A. ground-wave digital television system (ATSC system).

The operations of the high-definition television 1 are controlled by a control unit 2. An operation section 3 is adapted to, for example, select a reception channel. A tuner 4 is adapted to output an intermediate frequency signal (hereinafter refer to IF signal) obtained by tuning a radio signal received through an antenna 6 to an output signal of an oscillator 5. The signal received through the antenna 6 (receiver) contains a pilot signal. A SAW filter 7 is adapted to filter an IF signal output from the tuner 4 into a signal within a predetermined frequency band width. A demodulator 8 is adapted to perform A/D conversion on the IF signal filtered at the SAW filter 7 for providing a digital signal, and to extract the pilot signal for demodulation. The demodulation processing is carried out in digital signal processing. A decoder 9 decodes the digital signal demodulated in the demodulator 8 and outputs a video signal and an audio signal (analog signal) obtained by performing D/A conversion on this digital signal. A monitor 10 outputs an image and voice based on the video and audio signals output from the decoder 9. Further, a frequency information storage section 11 (memory)stores therein the information (hereinafter refer to error information) of an accuracy of the oscillator 5.

Figure 2:
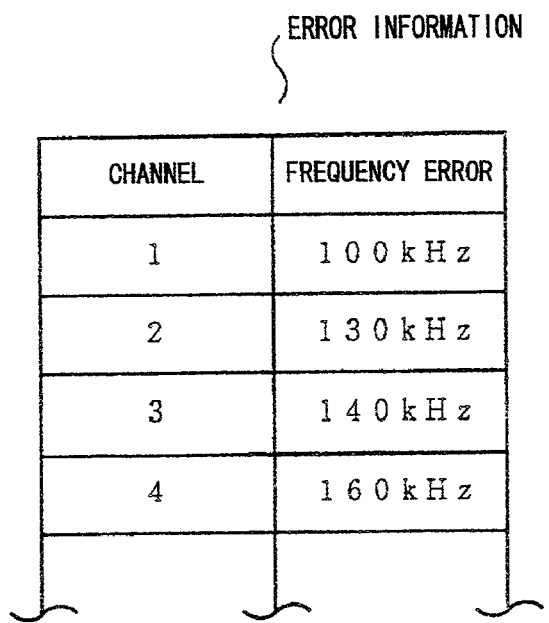
FIG. 2 is an illustration for showing a frequency error table stored in the high-definition television according to the embodiment of the invention.

FIG. 2 shows error information stored in the frequency information storage section 11. As shown in FIG. 2, this error information sets a frequency error for each channel. Error information is a difference (A−B) between a frequency B (hereinafter refer to appropriate frequency) defined for an output of the oscillator 5 for each channel and a frequency A actually controlling the oscillator 5. Therefore, by controlling the oscillator 5 at a frequency shifted by a frequency error set in this error information, a signal having an appropriate frequency can be output from the oscillator 5. This error information is set in the frequency information storage section 11 based on measurements of the characteristics of the oscillator at the time of manufacturing the device.

The error information is not limited to the information mentioned above but may be any information capable of outputting a signal of an appropriate frequency from the oscillator 5. For example, it may be a difference between an appropriate frequency of a signal output from the oscillator 5 under control and a frequency of a signal actually output from the oscillator 5.

The following will describe operations of the high-definition television 1 of this embodiment. When the channel is switched at the operation section 3, the high-definition television 1 reads out a frequency error stored in the frequency information storage section 11 for a switched channel. Based on thus read out frequency error, the control unit 2 controls the oscillator 5. The tuner 4 outputs an IF signal obtained by tuning a radio signal received through the antenna 6 to an output signal of the oscillator 5.

Since the control unit 2 controls the oscillator 5 based on the frequency error in this configuration, the oscillator 5 outputs a signal of an appropriate frequency for a currently selected channel. Therefore, the IF signal output from the tuner 4 can also be said to be an appropriate signal. The SAW filter 7 filters the IF signal output from the tuner 4 into a signal within a predetermined band width. The output of the SAW filter 7 is amplified at an amplifier, not shown, and then input to the demodulator 8.

As described above, the IF signal output from the tuner 4 can also be said to be an appropriate signal, so that a pilot signal is present in the signal within the predetermined band width input to the demodulator 8.

The demodulator 8 extracts the pilot signal from a digital signal obtained by performing A/D conversion on the input signal within the predetermined band width, and then demodulates the signal by using thus extracted pilot signal. The signal demodulated in the demodulator 8 is input to the decoder 9. The decoder 9 creates a video signal and an audio signal obtained by decoding the signal demodulated in the demodulator 8 and converts them into analog signals (D/A conversion) and then input them to the monitor 10. The monitor 10 outputs (displays) an image based on thus input video signal and also outputs voice based on thus input audio signal.

Thus, since the high-definition television 1 of this embodiment stores beforehand the frequency error indicating an output error of the oscillator 5 for each channel in the frequency information storage section 11 so that the control unit 2 may control the oscillator 5 based on a frequency error set for a selected channel, it is always possible to input to the tuner 4 a signal having an appropriate frequency for this selected channel. It is, therefore, possible for the tuner 4 to output an IF signal obtained by tuning a radio signal received through the antenna 6 to the signal always having the appropriate frequency. The IF signal output from the tuner 4, therefore, always contains a pilot signal. It is consequently possible for the demodulator 8 to extract this pilot signal and demodulate a received signal securely by using this extracted pilot signal.

The following explanation is an embodiment of the high-definition television 1 such that also takes into account the side of a broadcasting station shifting the frequency of a carrier wave (that is, offsetting the carrier wave) in broadcasting. The high-definition television 1 of this embodiment also has the same configuration as that shown in FIG. 1. Error information which is stored in the frequency information storage section 11 is different from above embodiment.

Figure 3:
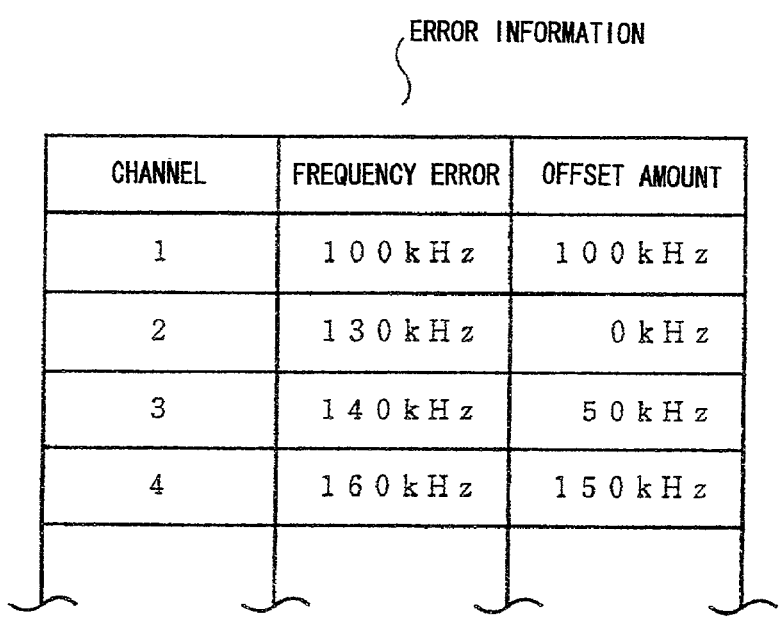
FIG. 3 is an illustration for showing a frequency error and an offset amount table stored in the high-definition television according to another embodiment of the invention.

FIG. 3 shows frequency error information and offset amount (deviation) information stored in the frequency information storage section 11 of the high-definition television 1 of this embodiment. The frequency information storage section 11 of the high-definition television 1 of this embodiment stores the frequency error described in the embodiment mentioned above and an offset amount described below in correlation with each other for each channel.

The offset amount refers to the information of an amount by which a carrier wave frequency which is shifted by the broadcasting station side is cancelled so that a pilot signal may be securely present in a signal within a predetermined band width output from the SAW filter 7. Specifically, it is the difference between a frequency appropriate for a currently selected channel and a frequency of a signal which is input to the tuner 4 from the oscillator 5 when the pilot signal could be extracted from a signal within a predetermined band width which is output from the SAW filter 7. Therefore, if the broadcasting station side does not shift the frequency of the carrier wave, the offset amount is 0.

As obvious from the above, the offset amount is different with a each broadcasting station and therefore cannot be set while the device is manufactured. To solve this problem, in the high-definition television 1 of this embodiment, an offset amount is detected when the channel is switched at the operation section 3, and then stored in the frequency information storage section 11.

Figure 4:
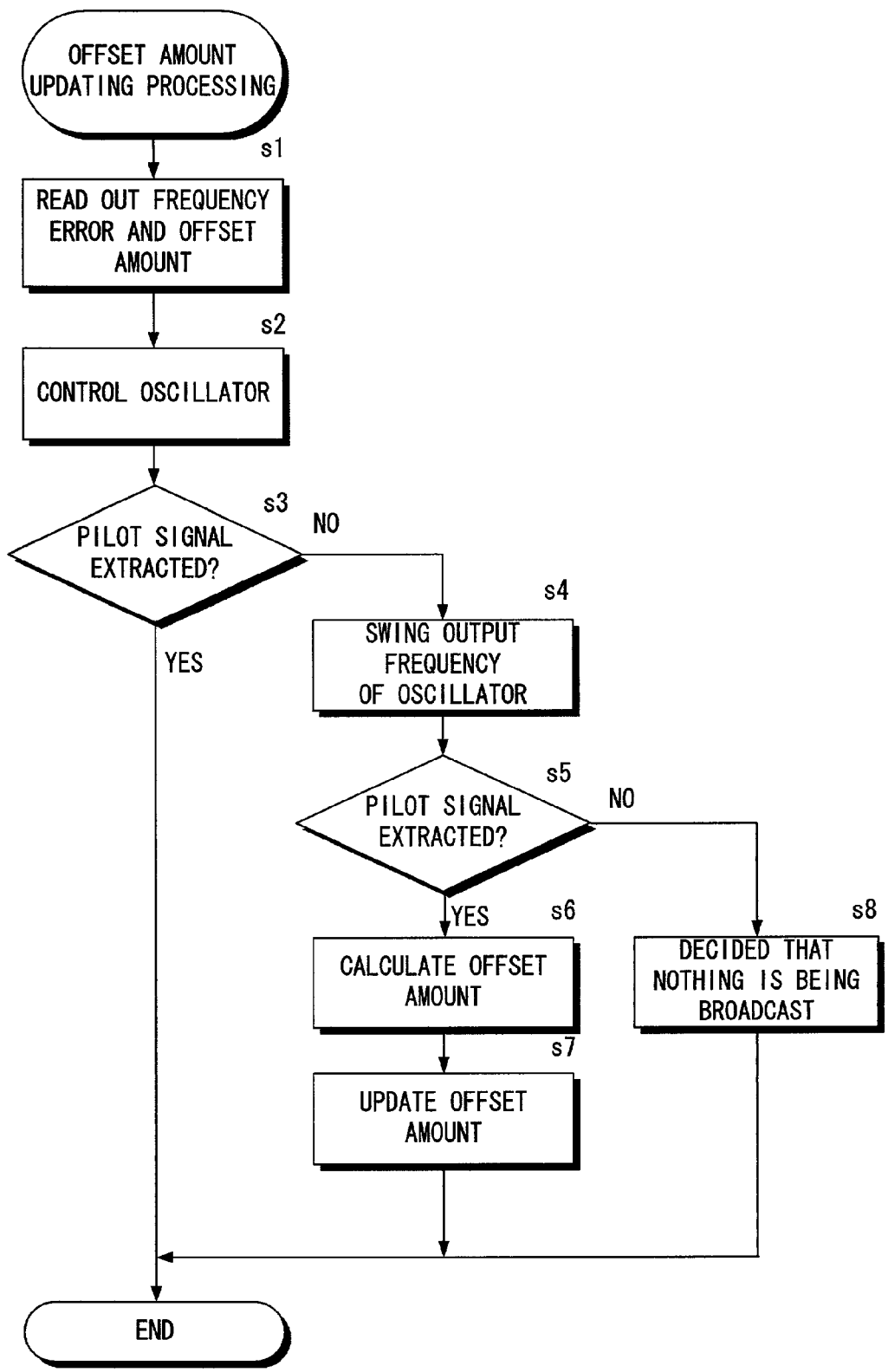
FIG. 4 is a flowchart for showing tuning processing with the high-definition television according to the embodiment of the invention.

FIG. 4 shows such processing for updating an offset amount that is performed when the channel is switched. When the channel is switched, the high-definition television 1 performs processing shown in FIG. 4 and then performs ordinary reception processing. The tuner 4, the SAW filter 7, the demodulator 8, the decoder 9, and the monitor 10 perform the same operations as those in the embodiment mentioned above and so their explanation is omitted.

When the channel is switched, the high-definition television 1 reads out a frequency error and an offset amount for a switched channel (s1). Based on the frequency error and the offset amount thus read out at s1, the control unit 2 controls the oscillator 5 so that an output of the oscillator 5 may have such a frequency (hereinafter refer to offset frequency) that is shifted by the offset amount a from frequency (that is, appropriate frequency referred to so in the embodiment mentioned above) of a carrier wave not shifted by the broadcasting station side (s2). Then, the control unit 2 decides whether a pilot signal could be extracted in the demodulator 8 (s3). If a pilot signal could be extracted at s3, the control unit 2 decides that a frequency error and an offset amount of this channel which are stored in the frequency information storage section 11 are appropriate, and then ends the proceeding.

Therefore, if appropriate values of these frequency error and offset amount are stored beforehand in the frequency information storage section 11, a signal having an appropriate frequency can be output from the oscillator 5 immediately for a selected channel. This reduces the time required to receive a signal for a selected channel.

On the other hand, if the pilot signal could not be extracted at s3, the control unit 2 decides either that an offset amount for this channel stored in the frequency information storage section 11 is not appropriate or that this channel is broadcasting nothing. In such a case, the following processing is performed. The control unit 2 swings the frequency of the signal output from the oscillator 5 within a predetermined range, for example, ±300 kHz to thereby decide whether the pilot signal can be extracted in the demodulator 8 (s4, s5). The center of this range is a frequency with an offset amount of 0.

If the pilot signal could be extracted in the demodulator 8 at s4 and s5, an offset amount for the currently selected channel is calculated based on a frequency of a signal which was output from the oscillator 5 when the pilot signal could be thus extracted, and then stored in the frequency information storage section 11 (s6, s7). Such processes correspond to a frequency deviation measuring section and a deviation information updating section given in the claims. Also, if the pilot signal could not be extracted in the demodulator 8, on the other hand, the control unit 2 decides that nothing is being broadcast through the currently selected channel (s8).

Thus, by performing the processes of the steps mentioned above of s4 through s8, the high-definition television 1 of this embodiment can receive a signal securely even if the broadcasting station shifts the frequency of the carrier wave.

Also, in such a case that a channel (broadcasting station) has undergone the process of the steps mentioned above of s4 through s7, its appropriate offset amount is stored in the frequency information storage section 11, so that when the same channel is selected, a signal can be received by the processes at s1 through s3.

Also, the invention can be realized by such a simple configuration that the frequency information storage section 11 is provided to store a frequency error and an offset amount so as to control the oscillator 5 based on these frequency error and offset amount stored in this frequency information storage section 11, thus suppressing down the cost of the device.

Although the embodiment mentioned above has performed processing shown in FIG. 4 when the channel is switched, the invention is not limited thereto; for example, this processing may be performed when each channel is detected on whether it is broadcasting, that is, during so-called auto scanning.

Also, if the user moved and the broadcasting station has changed from which a broadcast can be received by his high-definition television 1, the processing shown in FIG. 4 is performed, so that a broadcast can be received properly for a selected channel even without any special adjustment.

As mentioned above, by the invention, the error information of a frequency error of a signal output from the oscillator is stored so that an output of the oscillator can be controlled based on this stored error information, thus preventing the occurrence of poor reception due to inaccuracy of the oscillator. Also, even if the frequency of the carrier wave is shifted intentionally, the shift is stored as deviation information so that an output of the oscillator can be controlled based on this deviation information, thus realizing proper reception even with a shifted frequency of the carrier wave.

The invention is not limited to the configuration of the embodiments mentioned above but can be modified in a variety of manners without departing from the gist of the invention.

What is claimed is:

1. A receiving device used in high-definition television, which includes, a receiver for receiving a radio signal containing a pilot signal; an oscillator for outputting a signal having a frequency that corresponds to a currently selected channel; a tuner for outputting an intermediate frequency signal obtained by tuning the radio signal received at the receiver to the signal output from the oscillator; a filter for filtering the intermediate frequency signal within a frequency band width which the pilot signal can pass through output from the tuner; and a demodulator for extracting the pilot signal from the signal filtered at the filter and for demodulating the filtered signal by using the extracted pilot signal; comprising:

a frequency deviation measuring section for measuring a deviation of a frequency of a carrier wave for each channel;

a memory for storing deviation information based on a measurement result given by the frequency deviation measuring section and error information of a frequency error of the signal output from the oscillator;

a control unit for controlling the frequency of the signal output from the oscillator based on the deviation information and the error information stored in the memory; and a deviation information updating section for updating the deviation information stored in the memory by performing the frequency deviation measurement for the currently selected channel if the pilot signal could not be extracted by the demodulator, wherein, the frequency deviation measuring section detects the frequency of the signal output from the oscillator when the pilot signal could be extracted by the demodulator as changing the frequency of the signal output from the oscillator.

2. A receiving device used in high-definition television, comprising:

a frequency deviation measuring section for measuring a deviation of a frequency of a carrier wave for each of a plurality of channels;

a memory for storing, for each of the plurality of channels, deviation information based on a measurement result given by the frequency deviation measuring section, and error information of a frequency error of the signal output from an oscillator; and a control unit for controlling the frequency of the signal output from the oscillator based on the deviation information and the error information stored in the memory.

3. The receiving device of claim 2, further comprising:

a deviation information updating section for updating the deviation information stored in the memory by performing the frequency deviation measurement for the currently selected channel if a pilot signal could not be extracted by the demodulator.

4. The receiving device of claim 2, wherein the error information is based on measurements of characteristics of the oscillator.

* * * * *